United States Patent
Nakatsu et al.

[11] Patent Number: 5,900,642
[45] Date of Patent: May 4, 1999

[54] SEMICONDUCTOR LIGHT EMITTING DEVICE

[75] Inventors: Hiroshi Nakatsu; Jun-ichi Nakamura, both of Tenri, Japan

[73] Assignee: Sharp Kabushiki Kaisha, Osaka, Japan

[21] Appl. No.: 09/028,676

[22] Filed: Feb. 24, 1998

Related U.S. Application Data

[62] Division of application No. 08/861,763, May 22, 1997, Pat. No. 5,751,014, which is a continuation of application No. 08/496,225, Jun. 28, 1995, abandoned.

[30] Foreign Application Priority Data

Jun. 30, 1994 [JP] Japan .................................. 6-149842

[51] Int. Cl.$^6$ ...................................................... H01L 33/00
[52] U.S. Cl. ............................... 257/25; 257/13; 257/15; 257/87; 257/22; 257/201
[58] Field of Search ................................. 257/13, 17–18, 257/22, 25, 97, 87, 201

[56] References Cited

U.S. PATENT DOCUMENTS

| | | | |
|---|---|---|---|
| 4,675,709 | 6/1987 | Scifres et al. | 257/13 |
| 5,075,743 | 12/1991 | Behfar-Rad | 257/97 |
| 5,079,601 | 1/1992 | Esaki et al. | 257/22 |

FOREIGN PATENT DOCUMENTS 63-128776  6/1988  Japan .

OTHER PUBLICATIONS

Wilson, B. A., "Carrier Dynamics and Recombination Mechanisms in Staggered–Alignment Heterostructures," IEEE Journal of Quantum Electronics, vol. 24, No. 8, Aug. 1988, pp. 1763–1777.

Zhang, Y., et al., "InAs–InAsxSb1–x Type–II Superlatttice Midwave Infrared Lasers Grown on InAs Substrates," IEEE Journal of Selected Topics in Quantum Electronics, vol. 1, No. 2, Jun. 1995, pp. 749–756.

Lugagne–Delpon, et al., "Observation of Laser Emission in an InP–AlAnAs Type II Superlattice," Applied Physics Letters, vol. 60, No. 25, Jun. 1992, pp. 3087–3089.

*Primary Examiner*—John Guay
*Attorney, Agent, or Firm*—Nixon & Vanderhye, P.C.

[57] ABSTRACT

On a first cladding layer formed of n-type $Al_{0.7}Ga_{0.3}P$, an active region having a staggered-type (type II) heterojunction superlattice structure is disposed. The active region includes 50 light emitting layers formed of $Al_{0.1}Ga_{0.9}P$ doped with nitrogen and 50 barrier layers formed of $Al_{0.7}Ga_{0.3}P$. The 50 light emitting layers and the 50 barrier layers formed of such materials are stacked alternately to form 50 pairs. On the active region, a second cladding layer formed of $Al_{0.1}Ga_{0.9}P$ is disposed. In the formation of the active layers the composition of the light emitting layer and the barrier layer end the thickness of the barrier layer are controlled so that the isoelectronic level in the light emitting layer and the quantum level in the barrier layer will fulfill the resonance conditions. The carriers injected into the conduction band are confined in the quantum level in the barrier layer and transfer to the isoelectronic level in the light emitting layer by the resonance tunneling effect.

9 Claims, 10 Drawing Sheets

SEMICONDUCTOR LIGHT EMITTING DEVICE

This is a divisional of application Ser. No. 08/861,763, filed May 22, 1997, now U.S. Pat. No. 5,751,014, which is a continuation of application Ser. No. 08/496,225, filed Jun. 28, 1995, now abandoned.

BACKGROUND OF THE INVENTION

1. 1. Field of the Invention

The present invention relates to a semiconductor light emitting device having a semiconductor superlattice structure including a quantum well layer and a barrier layer, such as a light emitting diode (hereinafter, referred to as an "LED") and a semiconductor laser.

2. Description of the Related Art

Conventionally, a quantum well structure and a superlattice structure in a semiconductor light emitting device such as an LED and a semiconductor laser are widely used as a light emitting layer in order to remarkably improve light emitting characteristics such as emission efficiency and temperature characteristic and shorten the wavelength of the emitted light.

FIG. 12 is a view illustrating a band line-up (band alignment) of a conventional LED using a quantum well structure for an active layer. The conventional LED shown in FIG. 12 uses a heterojunction of $Al_xGa_{1-x}As/GaAs$-type materials. The band line-up shown in FIG. 12, which is obtained using a heterojunction of GaAs/AlGaAs-type materials, is referred to as a "type I" or "straddling type". An electron affinity ($\chi a$ and $\chi b$), which is an energy required to bring electrons from the vacuum level to the bottom of the conduction band, and a band energy gap (Ea and Eb) have the relationship of:

$\chi a > \chi b$; and $\chi a + Ea < \chi b + Eb$.

Generally in an LED using such materials, a cladding layer acting as a barrier layer has heterobarrier differences or band offsets of $\Delta Ev$ and $\Delta Ec$ with respect to electrons and holes as carriers which are injected to the active layer contributing to light emission. Due to such heterobarriers, the carriers can be effectively confined in the active layer. In the case of using a quantum well structure for an active layer as is shown in FIG. 12, the carriers can be effectively injected only into a quantum well acting as an active layer. Such a structure significantly improves the characteristics of an LED and a semiconductor laser.

The above-described structure is effective for a compound semiconductor containing GaAs/AlGaAs-type materials which are most generally used. On the other hand, in a device which uses a heterojunction of GaP/AlGaP-type materials in order to increase the band gap so as to realize a light emission of shorter wavelengths, a band line-up which is referred to as "type II" or "staggered type" is generated. In such a band line-up, the electron affinity ($\chi a$ and $\chi b$) and the band energy gap (Ea and Eb) have the relationship of:

$\chi a < \chi b$; and $\chi a + Ea < \chi b + Eb$.

In this specification, a layer having a smaller electron affinity $\chi a$ in the type II band alignment is referred to as a "well layer", and a layer having a larger electron affinity $\chi b$ is referred to as a "barrier layer".

In a device using the GaP/AlGaP-type materials, a heterobarrier formed between a cladding layer as a barrier layer and an active layer as a well layer is higher in the cladding layer with respect to a valence band and is higher in the active layer with respect to the conduction band. Therefore, in the type II heterojunction superlattice structure, as opposed to the type I heterojunction superlattice structure, holes are confined in the well layer acting as an active layer, and electrons are confined in the barrier layer acting as a cladding layer, but not in the well layer. As a result, the emission efficiency cannot be easily improved even by a heterojunction superlattice structure.

An example of a laser oscillator including a type II superlattice structure using InP/AlInAs-type semiconductor materials is described in *Appl. Phys. Lett.* 60 (25), pp. 3087–3089. However, it is described that oscillation is difficult even if the laser chip is cooled down to a liquid nitrogen temperature. Accordingly, in the case when the GaP/AlGaP-type materials are used, improvement in emission efficiency using a quantum well structure is impossible, and confinement of carriers by use of double heterojunction is difficult. Under these circumstances, only LEDs using homo-junction are conventionally used.

FIG. 14 is a diagram of a band line-up of a conventional LED having a homo-junction structure of GaP As is shown in FIG. 14, in the case when $Ga_{1-x}Al_xP$-type (x=0 to 1) semiconductor materials are used, the band gap energy is 2.25 to 2.45 eV. Such a range or energy corresponds to emission of green light, but the luminescence intensity is low due to indirect transition and thus is not practical. When such materials are used, the emission efficiency is improved by intentionally forming an emission center by doping. In detail, a V-group atom contained in such semiconductor materials is replaced with another V-group atom so as to form an isoelectronic trap in the semiconductor materials. In the case where nitrogen is selected as the isoelectronic trap, an emission level is formed at a position which is lower than the conduction band by $\Delta Ei=50$ meV. The wavelength of the light emitted by such a structure is obtained by:

$$Ei = Ea - \Delta Ei \qquad (1)$$

where Ea is the transition energy. By substituting Ea=2.25 eV and $\Delta Ei=50$ meV to equation (1), Ei=2.20 eV is found. From this, the wavelength of the emitted light is 565 nm.

FIG. 15 is a cross sectional view of a GaP LED 6 using nitrogen as an isoelectronic trap. The GaP LED 6 includes an n-type GaP substrate 1, an n-type GaP:N layer 2, and an p-type GaP:N layer 3 stacked in this order. Such a three-layer stack is interposed between electrodes 4 and 5. The GaP LED 6 having such a structure emits green light. The GaP LED 6 emits light having a luminance of 600 mcd when employed in a standard product (5 mmΦ mold lamp, 20 mA).

Japanese Laid-Open Patent Publication No. 63-128776 discloses a superlattice light emitting device formed of a GaP doped with nitrogen as an isoelectronic trap and AlGaP used for a barrier layer in order to improve the emission efficiency and shorten the wavelength of the emitted light. Since the type I double heterojunction structure cannot be formed for the above-described reason, the emission efficiency cannot be improved or the wavelength cannot be shortened easily beyond the level which is realized by homo-junction.

SUMMARY OF THE INVENTION

In one aspect of the present invention, a semiconductor light emitting device includes a superlattice structure including a quantum well layer and a barrier layer to form a staggered-type band line-up A wave function of one of electrons and holes existing at a quantum level in the barrier layer overlaps a wave function of one of electrons and holes existing at a localized level in the quantum well layer. The barrier layer is sufficiently thin to allow one of the electrons and the holes confined in the barrier-layer to transfer to the quantum well layer by a resonance tunneling effect.

In one embodiment of the invention, the quantum well layer contains an impurity for supplying an emission center level which is added thereto. The barrier layer is sufficiently thin to allow carriers in the quantum level in the barrier layer to transfer to the emission center level in the quantum well layer by a resonance tunneling effect.

In one embodiment of the invention, the quantum well layer contains an atom for supplying an isoelectronic level. The barrier layer is sufficiently thin to allow electrons in the quantum level of the conduction band in the barrier layer to transfer to the isoelectronic level in the quantum well layer by a resonance tunneling effect.

In another aspect of the present invention, a semiconductor light emitting device has an isoelectronic center and includes a superlattice structure active region including a quantum well layer formed of $Al_xGa_{1-x}P$ where an alloy composition ratio x is $0 \leq x < 1$ and a barrier layer formed of $Al_yGa_{1-y}P$ where an alloy composition ratio y is $0 < y < 1$ and larger than x, the quantum well layer and the barrier layer being stacked alternately. The barrier layer is sufficiently thin to allow electrons in the quantum level of the conduction band in the barrier layer to transfer to an isoelectronic level provided by the isoelectronic center of the conduction band in the quantum well layer.

In one embodiment of the invention, the alloy composition ratios x and y is selected so that the energy difference in the conduction band between in the quantum well layer and in the barrier layer is no greater than a sum of the difference between the isoelectronic level in the quantum well layer and an energy level of the conduction band, and the quantum level in the barrier layer In one embodiment of the invention, a semiconductor light emitting device further includes a substrate of a first conductivity type; a first cladding layer of the first conductivity type; and a second cladding layer or a second conductivity type. The superlattice structure is interposed between the first cladding layer and the second cladding layer.

In one embodiment of the invention, the first cladding layer has an n-type conductivity and has substantially an identical composition with the barrier layer, and the second cladding layer has a p-type conductivity and has substantially an identical composition with the quantum well layer.

In still another aspect of the present invention, a semiconductor light emitting device has an emission center and includes a superlattice structure active region including a quantum well layer formed of $Zn_{1-x}Cd_xS$ where an alloy composition ratio x is 0 to 1 and a barrier layer formed of ZnSe, the quantum well layer and the barrier layer being stacked alternately. The barrier layer is sufficiently thin to allow holes in the quantum level of a valence band in the barrier layer to transfer to an emission center level provided by the emission center of the valence band in the quantum well layer.

In one embodiment of the invention, the alloy composition ratio x is selected so that the energy difference in the valence band between in the quantum well layer and in the barrier layer is no greater than a sum of the difference between the emission center level in the quantum well layer and an energy level of the valence band, and the quantum level in the barrier layer.

In still another aspect of the present invention, a semiconductor light emitting device has an emission center and includes a superlattice structure active region including a quantum well layer formed of ZnSe and a barrier layer formed of $Zn_{1-x}Cd_xS$ where an alloy composition ratio x is 0 to 1, the quantum well layer and the barrier layer being stacked alternately. The barrier layer is sufficiently thin to allow holes in the quantum level of the conduction band in the barrier layer to transfer to an emission center level provided by the emission center of the conduction band in the quantum well layer.

In one embodiment of the invention, the alloy composition ratio x is selected so that the energy difference in the conduction band between in the quantum well layer and in the barrier layer is no greater than a sum of the difference between an isoelectronic level in the quantum well layer and an energy level of the conduction band, and the quantum level in the barrier layer.

According to the present invention, an impurity is selectively doped into a well layer in a staggered-type (type II) superlattice structure so that a localized level such as an isoelectronic level or an emission center level, and the composition of the well layer and the barrier layer and the thickness of the barrier layer are controlled so that the above-mentioned localized level in the well layer and the quantum level in the barrier layer will fulfill the resonance conditions In such a structure, the carriers are confined in the quantum level of the conduction band in the barrier layer and transfer to the above-mentioned localized level in the well layer by a resonance tunneling effect. In this manner, confinement of the carriers is realized in a staggered-type heterojunction superlattice structure. Improvement in the emission efficiency and the temperature characteristics and reduction in the wavelength of the emitted light are realized.

The first cladding layer has an n-type conductivity and has substantially an identical composition with the barrier layer, and the second cladding layer has a p-type conductivity and has an identical composition with the well layer. Due to such a structure, injection of the electrons and the holes into the well layer can be performed smoothly.

In the case where a light emitting layer having a staggered-type (type II) heterojunction superlattice structure is interposed between two cladding layers, the electrons and the holes can be confined at a high efficiency.

Thus, the invention described herein makes possible the advantages of providing a semiconductor light emitting device for improving emission efficiency and shortening the wavelength of the emitted light by efficiently confining carriers in a light emitting layer using the type II (staggered-type) heterojunction superlattice structure.

These and other advantages of the present invention will become apparent to those skilled in the art upon reading and understanding the following detailed description with reference to the accompanying figures

DESCRIPTION OF THE PREFERRED EMBODIMENTS

Hereinafter, the present invention will be described by way of illustrative examples with reference to the accompanying drawings.

EXAMPLE 1

A semiconductor light emitting device in a first example according to the present invention will be described with reference to FIGS. 1 through 7.

Figure 1:
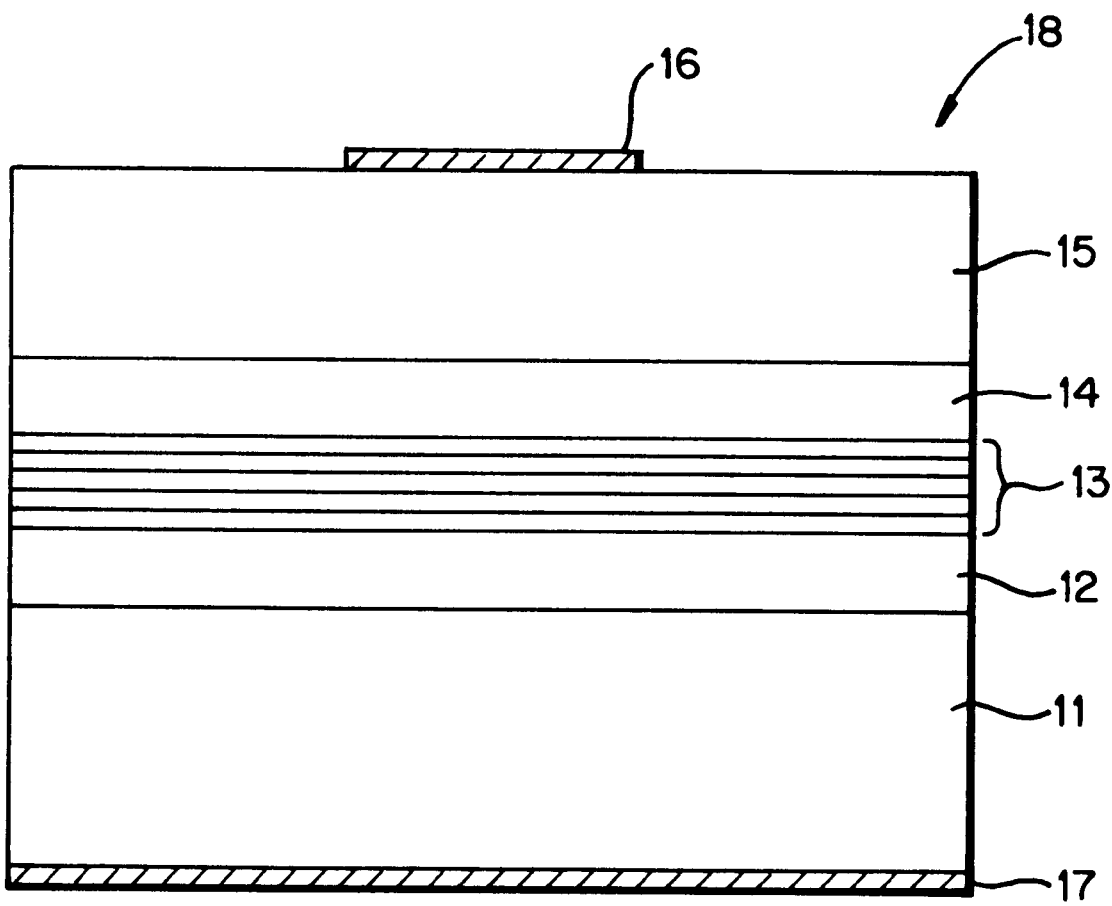
FIG. 1 is a cross sectional view of an LED in a first example according to the present invention.

FIG. 1 is a cross sectional view of an LED 18 in the first example. The LED 18 includes a substrate 11 formed of n-type GaP which is lattice-matched with an $Al_xGa_{1-x}P$-type material. On the substrate 11, a lower (first) cladding layer 12 formed of n-type $Al_{0.7}Ga_{0.3}P$ is disposed in a thickness of 1 μm for confining holes in a valence band. On the lower cladding layer 12, an active region 13 having a staggered-type (type II) superlattice structure is disposed. The active region 13 includes 50 well layers (light emitting layers; each having a thickness of 5 nm) formed of $Al_{0.1}Ga_{0.9}P$ doped with nitrogen and 50 barrier layers each having a thickness of 4 nm formed of $Al_{0.7}Ga_{0.3}P$. The 50 well layers and 50 barrier layers formed of such materials are stacked alternately to form 50 pairs.

On the active region 13, an upper (second) cladding layer 14 formed of p-type $Al_{0.1}Ga_{0.9}P$ is disposed in a thickness of 2 μm for confining electrons in a conduction band. On the upper cladding layer 14, a current diffusion layer 15 formed of p-type $Al_{0.1}Ga_{0.9}P$ is disposed in a thickness of 5 μm. A p-type electrode 16 is disposed on a central area of the current diffusion layer 15, and an n-type electrode 17 is disposed on a surface of the substrate 11 opposite to the lower cladding layer 12.

In the formation of the active region 13, the composition of the well layer and the barrier layer and the thickness of the barrier layer are controlled so that the isoelectronic level in the well layer and the quantum level in the barrier layer will satisfy the resonance conditions in the conduction band. The current diffusion layer 15 is formed to have a resistance which is sufficiently low to allow light having a wavelength emitted by the well layer to be transmitted therethrough. Depending on the wavelength of the emitted light, the current diffusion layer 15 can be formed of p-type GaP. After the layers 12 through 15 are formed by epitaxial growth on the substrate 11, the electrodes 16 and 17 are formed on the current diffusion layer 15 and the substrate 11, respectively. The resultant LED 18 has a staggered-type (type II) superlattice structure including quantum well layers and barrier layers.

Figure 2:
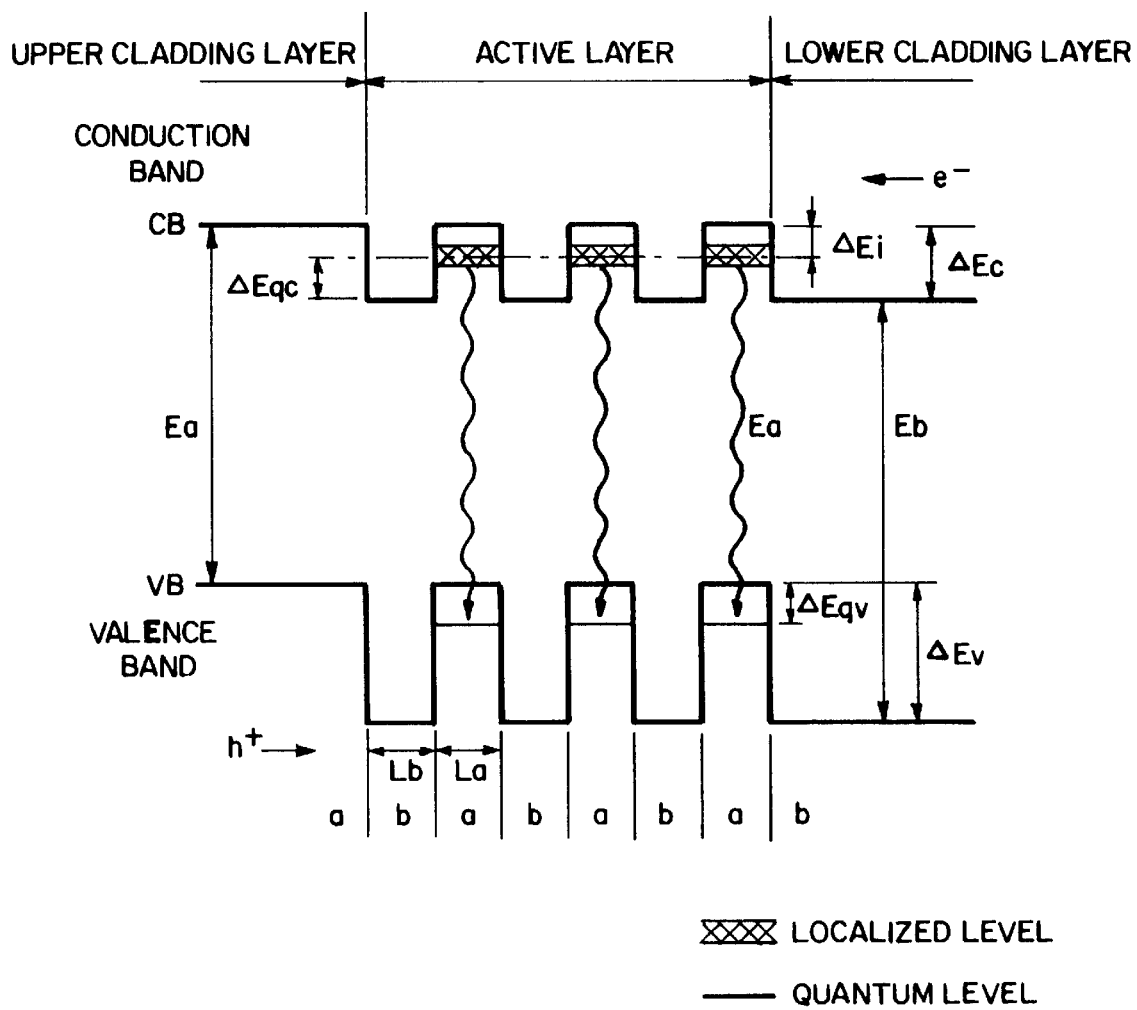
FIG. 2 is a diagram illustrating a band line-up of an LED having a staggered-type (type II) heterojunction superlattice structure.

The composition of the well layer and the barrier layer and the thickness of the barrier layer need to be controlled so that the isoelectronic level in the well layer and the quantum level in the barrier layer will satisfy the resonance conditions in the conduction band for the following reasons:

FIG. 2 is a diagram illustrating a band line-up in the LED 18 for describing the principle of the present invention. As is shown in FIG. 2, the active region 13 has a staggered-type (type II) superlattice structure including the well layers and the barrier layers. The active region 13 is held between the lower cladding layer 12 and the upper cladding layer 14 to form a double-hetero structure. The well layers (indicated by reference letter "a" in FIG. 2) have an isoelectronic level (localized level), and the barrier layer (indicated by reference letter "b" in FIG. 2) have a quantum level. The band energy gap Eg of the well layer a is represented by Ea, and the band energy gap Eg of the well layer b is represented by Eb. The band discontinuity energy of the conduction band obtained in a heterojunction structure is represented by ΔEc, and such an energy of the valence band is represented by ΔEv. The thickness of each well layer a is represented as La, and the thickness of each barrier layer b is represented as Lb.

Conventionally in a staggered-type (type II) superlattice structure, the holes are confined in the well layers a acting as a light emitting layer but electrons are confined in the barrier layers b. Accordingly, even if the active region having a superlattice structure is held between two cladding layers to form a double-hetero structure, an effective recombination of the carriers does not occur. Thus, the emission efficiency cannot be improved.

According to the present invention, the thickness Lb of each barrier layer b is sufficiently reduced to less than the de Broglie wavelength of the electrons (approximately 10 nm). By such reduction, the wave function of the carriers in the quantum level ΔEqc in the barrier layer b extends to the well layer a. Thus, the carriers go into the well layer a by a resonance tunneling effect. Usually, in the case where there is no emission center for providing the well layer a with an isoelectronic level, the light emitting characteristics cannot be improved even if the carriers go into the well layer a by the extension of the wave function of the electrons in the barrier layer b into the well layer a. In the case where an isoelectronic level (localized level) Ei of the adjacent well layer a exists at the same level as the quantum level in the barrier layer b, the carrier in the barrier layer b transfer to the isoelectronic level (localized level) in the well layer a, and thus an effective recombination of the carrier occurs in the well layer a. Accordingly, by appropriately selecting the composition of the well layer a and the barrier layer b and the thickness of the barrier layer b so as to fulfill the condition of:

$$\Delta Ec - \Delta Ei = \Delta Eqc \qquad (2),$$

the electrons injected into the conduction band are confined in the barrier layer b and then transfer to the well layer a by the resonance tunneling effect. Then, a recombination of the electrons and the holes occurs in the well layer a.

Figure 3:
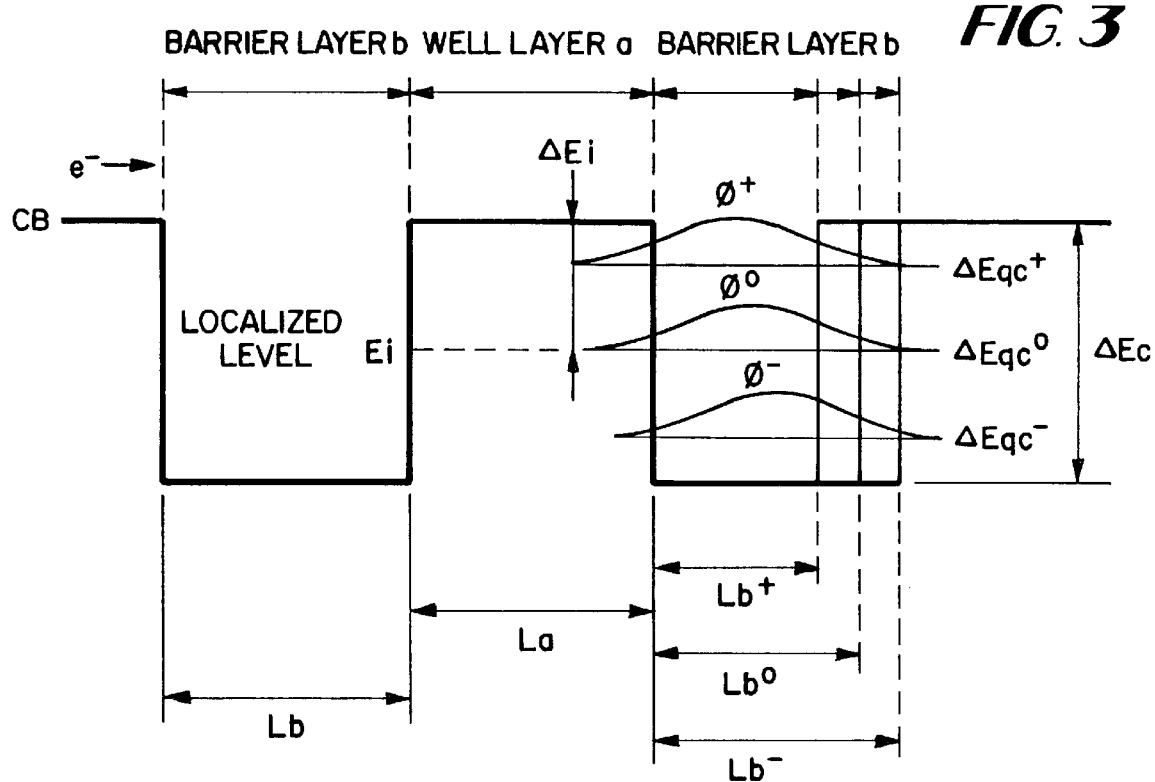
FIG. 3 is a view illustrating how the quantum level of the conduction band changes in accordance with the thickness of the barrier layer.
Figure 4:
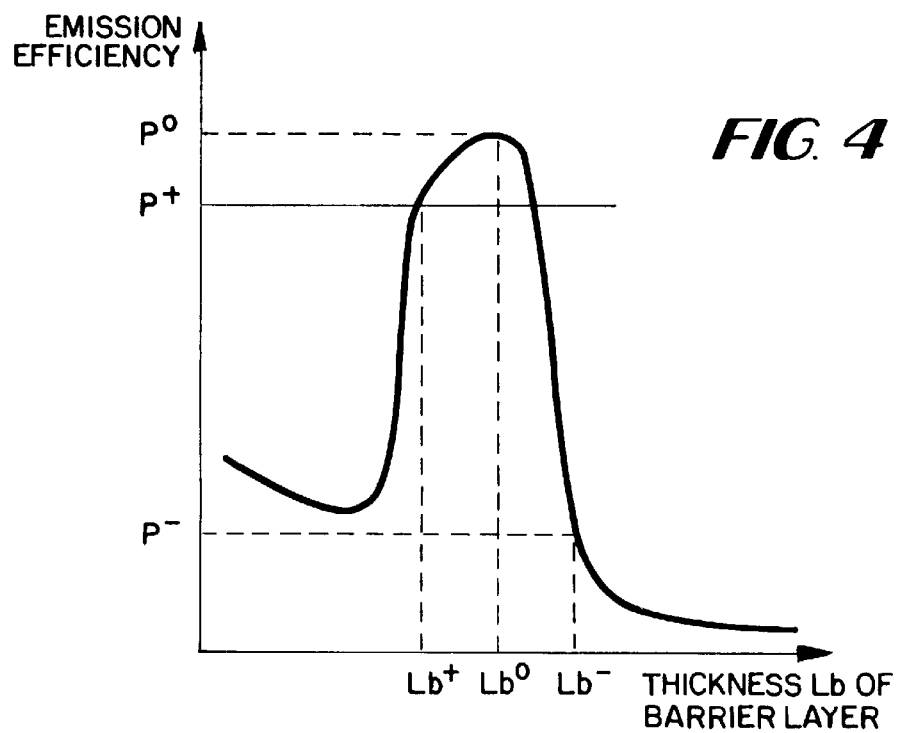
FIG. 4 is a graph illustrating the dependency of the emission efficiency on the thickness of the barrier layer.

The resonance tunneling effect will be explained with reference to FIGS. 3 and 4. FIG. 3 is a diagram illustrating the principle of resonance tunneling of the isoelectronic level (localized level). In detail, FIG. 3 illustrates how the quantum level ΔEqc of the conduction band in the barrier layer b changes in accordance with the thickness Lb of the barrier layer b. FIG. 4 is a graph illustrating the dependency of the emission efficiency P on the thickness Lb of the barrier layer b.

As is shown in FIG. 3, the quantum level ΔEqc increases as the thickness Lb decreases, and the quantum level ΔEqc decreases as the thickness Lb increases. The wave function φ of the electrons confined in the barrier layer b extends into the well layer a, and thus the electrons go into the well layer a. As the thickness Lb decreases, the transmission coefficient of the electrons into the well layer a increases.

For example, when the thickness Lb=Lb$^-$(FIG. 4), the quantum level Eqc=Eqc$^-$. Thus, ΔEc−ΔEi>ΔEqc. The resonance conditions are not fulfilled. Even if the electrons in the barrier layer b transmit to the well layer a, the electrons are at a lower energy level than the isoelectronic level (localized level). Thus, an effective recombination of the electrons and the holes does not occur in the well layer a. Further, since the extension of the wave function of the electrons in the barrier layer b into the well layer a is small, the emission efficiency is as low as P$^-$ as is shown in FIG. 4.

When the thickness Lb=Lb$^0$, the quantum level Eqc=Eqc$^0$. Thus, ΔEc−ΔEi=ΔEqc. The resonance conditions are fulfilled. The electrons in the barrier layer b can transfer to the isoelectronic level (localized level) In the well layer a by the resonance tunneling effect, and thus an effective recombination of the electrons and the holes occurs in the well layer a. As is shown in FIG. 4, the emission efficiency significantly improves to P$^0$.

When the thickness Lb=Lb$^+$, the quantum level Eqc=Eqc$^+$. Namely, the quantum level Eqc is larger than Eqc$^0$ by $k_bT$ (0 to 10 meV). Thus, ΔEc−ΔEi<ΔEqc (ΔEc<ΔEqc+ΔEi). Although the two levels are not equal, the extension of the wave function of the electrons in the barrier layer b is larger as the thickness Lb of the barrier layer b is smaller. Further, the electrons which transmit to the well layer a from the higher energy level than the isoelectronic level (localized level) are trapped in the localized level before being recombined with the holes. Accordingly, the emission efficiency is negligibly reduced. When the thickness Lb of the barrier layer b is further reduced, ΔEc⊢ΔEqc. Since the electrons cannot be confined in such a state, the emission efficiency is significantly reduced as is shown in FIG. 4.

The curve indicating the emission efficiency P vs. thickness Lb characteristic has a maximum value when the thickness Lb of the barrier layer b is Lb$^0$. The isoelectronic level (localized level) in the well layer a and the quantum level in the barrier layer b fulfill the resonance conditions at Lb$^0$ and the vicinity thereof. As is easily appreciated from FIG. 4, the range of the thickness Lb which fulfills the resonance conditions is wider on the side of Lb$^+$ than on the side of Lb$^-$.

As is described above, in order to effectively use the electrons in the barrier layer b for light emission, it is required that the quantum level in the barrier layer b and the localized level in the well layer a should be substantially equal or that the quantum level in the barrier layer b is larger than the localized level in the well layer a by 0 to $k_bT$ ($k_b$: the Boltzmann constant; T: the absolute temperature). In other words, it is required that the quantum level in the barrier layer b and the localized level in the well layer a should fulfill the resonance conditions. The LED 18 is designed so that the alloy composition and the thickness of the barrier layer b will correspond to the quantum level in such a range. In detail, the well layer a and the barrier layer b are formed as follows: First, the alloy composition in the well layer a and the barrier layer b are controlled so that the isoelectronic level (localized level) in the well layer a and the quantum level of the conduction band in the barrier layer b will substantially satisfy the resonance conditions. Then, the thickness of the barrier layer b is controlled so that the quantum level of the conduction band in the barrier layer b will resonate with the isoelectronic level (localized level) in the well layer a. In actual formation, the thickness Lb of the barrier layer b is preferably in the range between Lb$^0$ and Lb$^+$, or between a thickness less than Lb$^-$ but slightly more than Lb$^0$ and a thickness in the vicinity of Lb$^+$.

With reference to FIGS. 5A, 5B, 5C, 6A and 6B, the reason why such a range is preferable for the thickness Lb will be described in detail.

Figure 5A:
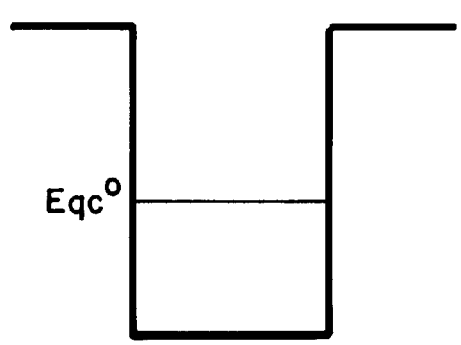
FIGS. 5A through 5C are views illustrating the relationship between the quantum level and the temperature.
Figure 5B:
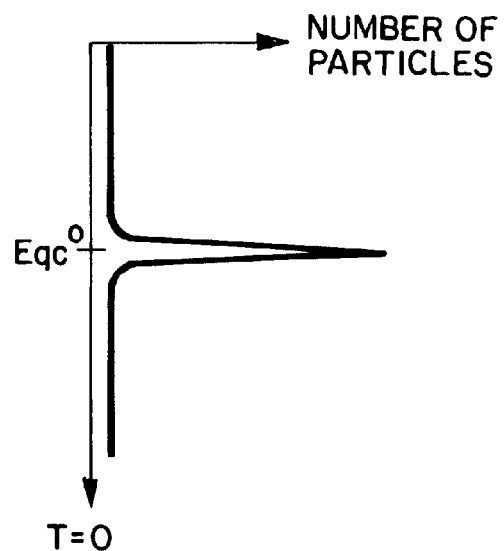
Figure 5C:
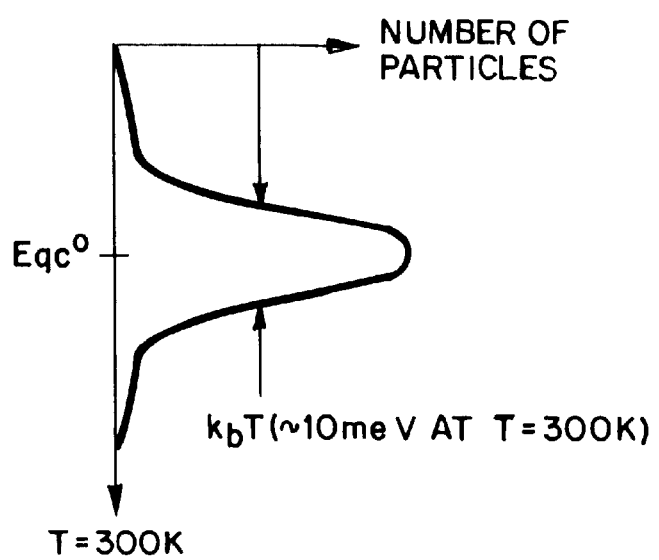
Figure 6A:
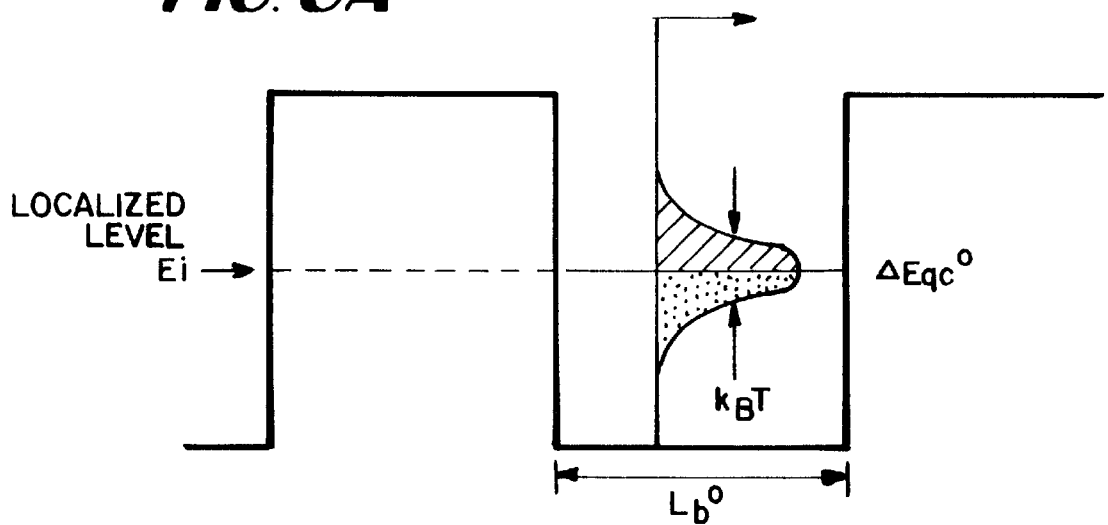
FIGS. 6A and 6B are views illustrating the relationship between the quantum level and the emission efficiency.
Figure 6B:
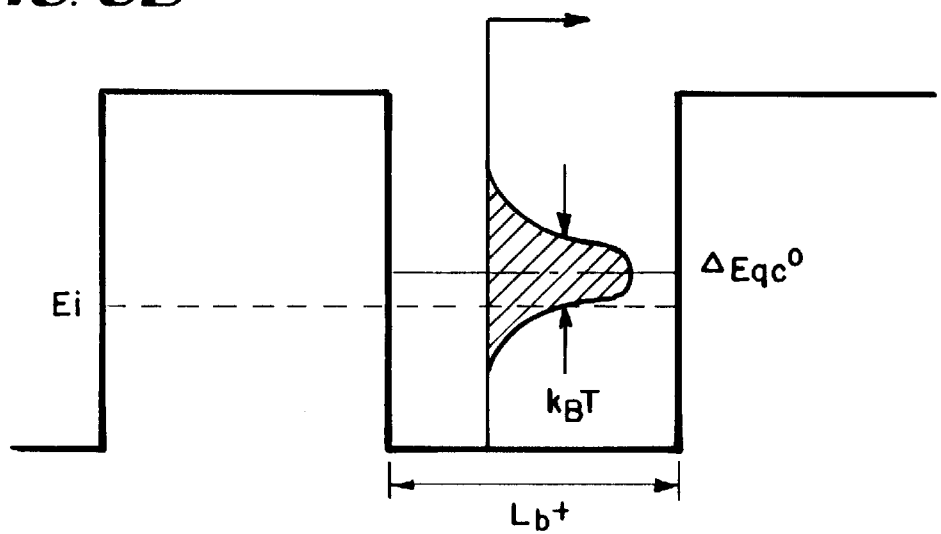

As is shown in FIGS. 5A and 5B, at a certain energy level Ei, all the electrons or all the holes have the energy level Ei at the absolute temperature (T=0 K). As is shown in FIG. 5C, at room temperature (T≈300 K), the energy level of the electrons or holes has a certain range above and below Eqc. The full width half maximum thereof is statistically $k_bT$ (approximately 10 meV at T=300 K). Accordingly, the electrons at the quantum level ΔEqc actually exist in the range of $k_bT$. The electrons having a lower energy than the localized level Ei (in the dotted area in FIG. 6A) cannot transfer to the localized level Ei, but the electrons having a higher energy than the localized level Ei (in the hatched area in FIG. 6A) can transfer to the localized level Ei. In the case where the quantum level Eqc is higher than the localized level Ei by $k_bT$ as is shown in FIG. 6B, substantially all the electrons in the range of $k_bT$ around the quantum level Eqc can transfer to the localized level Ei by the resonance tunneling effect. Accordingly, even if the localized level Ei is not equal to the quantum level Eqc, the emission efficiency is not reduced significantly, and thus satisfactory emission can be realized when the thickness of the barrier layer b is Lb$^+$.

Figure 7:
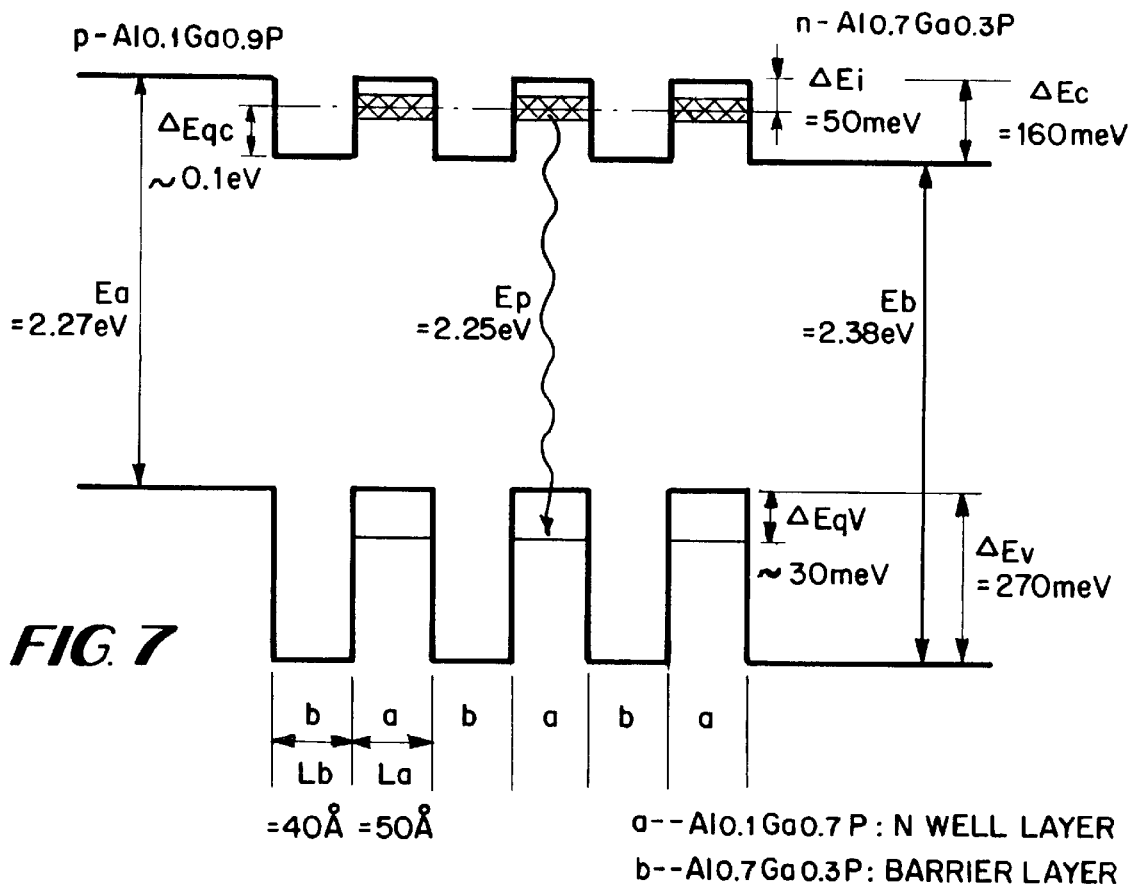
FIG. 7 is a view illustrating a detailed band line-up of the LED shown in FIG. 1.

FIG. 7 is a diagram illustrating a detailed band line-up of the LED 18 shown in FIG. 1. The LED 18 has a staggered-type (type II) heterojunction superlattice structure of Al$_x$Ga$_{1-x}$P/GaP-type materials and the band gap width of Al$_x$Ga$_{1-x}$P/GaP is changed in accordance of the alloy composition ratio of aluminum (Al). In the LED 18 formed of such materials, point X is considered in space k of the band structure, the band gap of GaP is:

$$\Delta E_{GaP}=2.25 \text{ eV, and}$$

the band gap of AlP is:

$$\Delta E_{AlP}=2.44 \text{ eV.}$$

Figure 13:
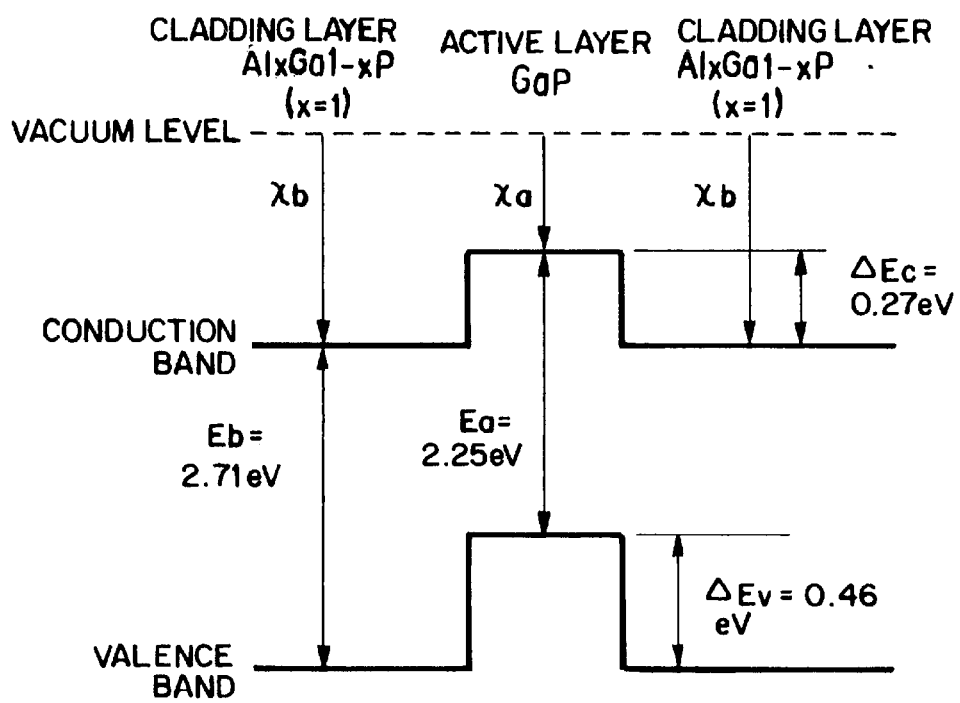
FIG. 13 is a diagram illustrating a band line-up of another conventional LED having a heterojunction.
Figure 14:
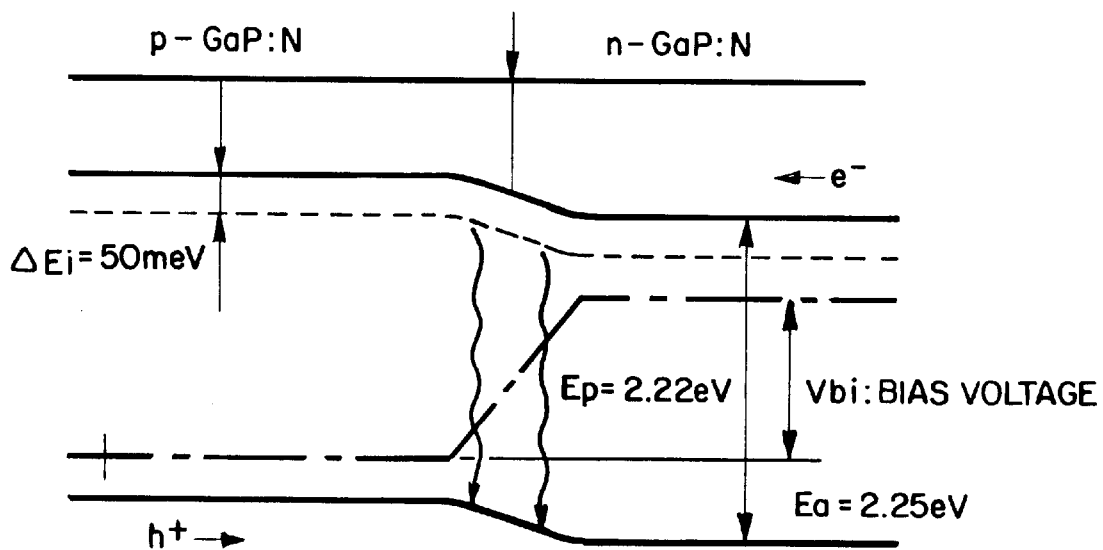
FIG. 14 is a diagram illustrating a band line-up of a conventional LED having a homo-junction.
Figure 15:
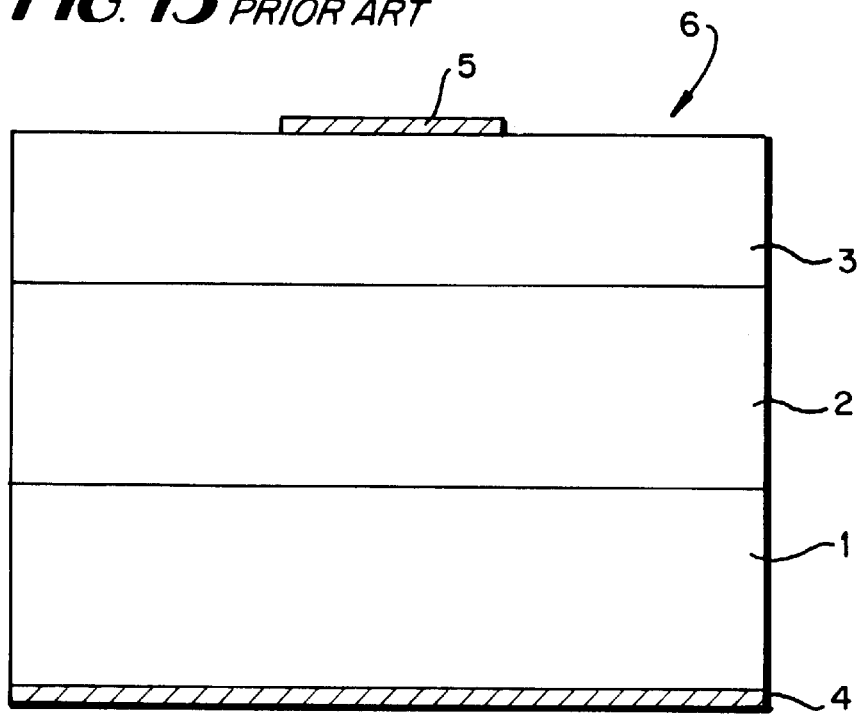
FIG. 15 is a cross sectional view of a conventional GaP LED using an isoelectronic trap.

The distribution ratio of the energy to the valence band and the conduction band when the GaP/AlP layers are formed by heterojunction is:

$$\Delta Ec/\Delta Ev=0.27/0.46=0.59 \tag{3}$$

where the energy level difference in GaP between in the conduction band and the valence band is ΔEc, and such difference in AlP is ΔEv. In this case, the band alignment is as shown in FIG. 13. Since the band gap energy of Al$_x$Ga$_{1-x}$P/GaP increases in proportion to the alloy composition ratio x, the band gap energy ΔEg(x) obtained at an arbitrary alloy composition ratio x is:

$$\Delta Eg(x)=\Delta E_{GaP}+(\Delta E_{Alp}-\Delta E_{GaF})\cdot x \quad (4)$$

From equations (3) and (4), $\Delta Ec$ and $\Delta Ev$ at an arbitrary alloy composition ratio x are found. In the case where AlGaP-type materials are used, nitrogen, which is a V-group element, is doped to the materials to replace phosphorus with nitrogen. Thus, a so-called isoelectronic trap level is formed immediately below the conduction level. As a result, even if a semiconductor material which is originally of the indirect transition type is used, the electrons in the conduction band transfer from point X to point Γ and are recombined with holes as direct transition-type excitons at point Γ. As is appreciated from this, the possibility that the electrons transfer for recombination is significantly raised by introducing an isoelectronic level when the AlGaP-type materials are used. The isoelectronic trap level is lower than the band width of the conduction band by the binding energy, and is expressed by $\Delta Ei$ approximately 50 meV although depending on the concentration of nitrogen. As is described above, the heterojunction of $Al_xGa_{1-x}P/Al_yGa_{1-y}P$-type materials is designed so as to fulfill the condition of equation (1) In the case where the alloy composition ratio x in the well layer a is 0.1, and the alloy composition ratio y in the barrier layer b is 0.7 as is illustrated in FIG. 7, Ea=2.27 eV and Eb=2.38 eV. In accordance with equation (3), $\Delta Ec$=0.16 eV and $\Delta Ev$=0.27 eV. By selectively doping nitrogen so as to form an isoelectronic trap level only in the well layer a, an isoelectronic trap level is formed in the well layer a at a position which is lower than the conduction band by $\Delta Ei$=50 meV.

In order to allow the wave function of the carriers to extend to the well layer a to cause the carriers to go into the well layer a, the barrier layer b needs to have a smaller thickness than the de Broglie wavelength of the electrons. Such a thickness of the barrier layer b is 0.5 to 10 nm. A quantum level is formed in the conduction band in the barrier layer b, and a first quantum level is found by:

$$\Delta Eqc=(h/2\pi)^2/2m_e(\pi/Lb)^2 \quad (5)$$

where the thickness of the barrier layer b is Lb, the effective mass of the electrons is $m_e$, and the Planck's constant is h. In order to transfer the electrons in the barrier layer b to the isoelectronic level in the well layer a by the resonance tunneling effect, equation (2) needs to be fulfilled. The thickness Lb of the barrier layer b is determined so that $\Delta Eqc$=0.1 eV is obtained by substituting $\Delta Ei$=50 meV and $\Delta Ec$=0.16 eV into equation (2). When the effective mass $m_e$ of the electrons in the barrier layer b is 0.13 $m_o$ ($m_o$: the rest mass of the electrons), the resonance tunneling effect is caused when Lb is 4 nm from equation (4). By designing the quantum level in the barrier layer b in this manner, the electrons injected into the barrier layer b effectively transfer to the well layer a (light emitting layer) and contributes to light emission.

The quantum level $\Delta Eqv$ is formed in the valence band in the well layer a. In the case when the effective mass of the holes is 0.54 $m_o$, a first quantum level thereof is approximately found by:

$$\Delta Eqv=(h/2\pi)^2/2m_h(\pi/La)^1 \quad (6)$$

where the thickness of the well layer a is La, the effective mass of the holes is $m_h$, and the Planck's constant is h. Since the quantum level $\Delta Eqv$ changes in accordance with the thickness La of the well layer a, the wavelength of the emitted light can be changed. For example, when the thickness La is 5 nm, $\Delta Eqv$=28 meV where the effective mass is 0.54 $m_o$. In such a case, the transition energy Ep of the well layer a is expressed by equation (7).

$$Ep=\Delta Ea-\Delta Ei+\Delta Eqv \quad (7)$$

By substituting the above-mentioned numerical figures into equation (7), Ep=2.25 eV, and thus the wavelength λp=552 nm is found.

The LED 18 obtained in the first example is a high brightness LED for emitting purely green light having a luminance of 6 cd and a wavelength of 550 nm. Such a luminance is 10 times higher and such a wavelength is shorter by 15 to 20 nm than those of light emitted by the conventional device having a homo-junction of GaP. Accordingly, purely green light which cannot be obtained by the conventional LED can be emitted.

In the first example, green light is emitted by doping nitrogen in an amount of approximately $10^{18}$ cm$^{-3}$. By increasing the amount of nitrogen by approximately $10^{19}$ cm$^{-3}$, the trap level is deepened. By designing an LED so that the quantum level in the barrier layer b corresponds to $\Delta Ei$ obtained in that case, yellow light having a wavelength of 590 nm or the vicinity thereof can be emitted.

In this example, nitrogen is used as an impurity to form an isoelectronic trap level. Bi (bismuth) can also be used. Since the binding energy of Bi is larger than that of nitrogen, $\Delta Ei$=110 meV. In order to fulfill the resonance conditions expressed in equation (2), the thickness Lb of the barrier layer b is 7.5 nm.

In this example, AlGaP-type materials are grown on the GaP substrate 11. The same effects are achieved by growing AlGaAsP-type materials on the GaP or GaAs substrate.

EXAMPLE 2

A light emitting device in a second example according to the present invention will be described with reference to FIGS. 8 and 9.

Figure 8:
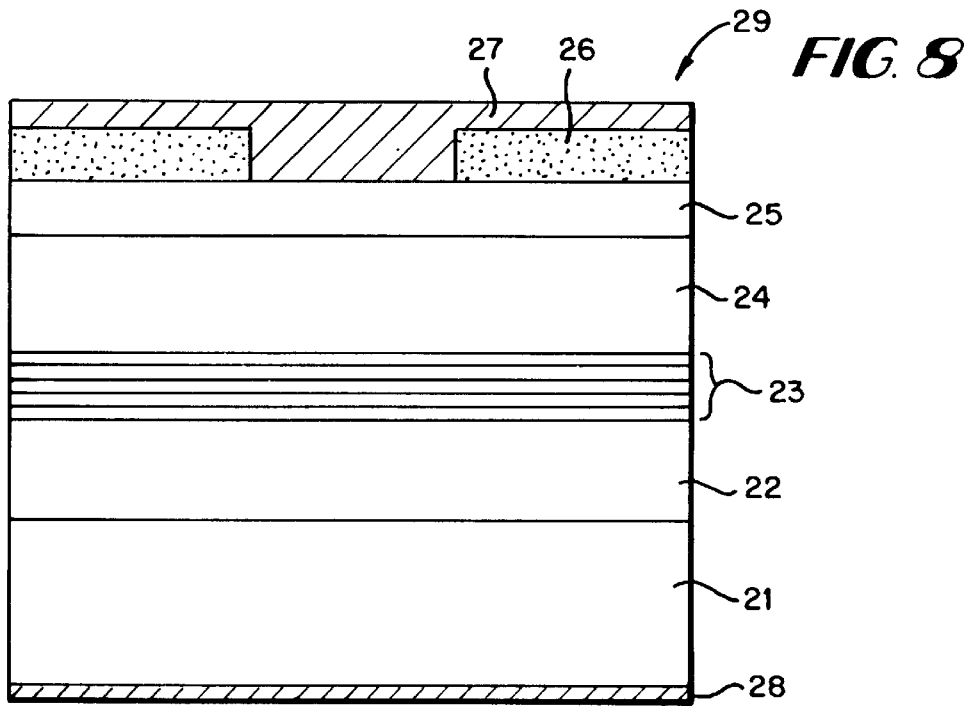
FIG. 8 is a cross sectional view of a semiconductor laser in a second example according to the present invention.

FIG. 8 is a cross sectional view of a semiconductor laser 29 in the second example. The semiconductor laser 29 includes a substrate 21 formed of n-type GaAs which is lattice-matched with ZnSe/$Zn_{0.4}Cd_{0.6}$S-type materials. On the substrate 21, a lower (first) cladding layer 22 formed of n-type ZnSe doped with chlorine is disposed in a thickness of 1.5 μm. On the lower cladding layer 22, an MQW (multi-quantum well) active region 23 is disposed in a thickness of 61.2 nm. The MQW active region 23 includes 10 barrier layers formed of non-doped ZnSe and 10 well layers formed of $Zn_{0.4}Cd_{0.6}$S:Na. The 10 barrier layers and the 10 well layers formed of such materials are stacked alternately to form 10 pairs.

On the MQW active region 23, an upper (second) cladding layer 24 formed of p-type ZnSe doped with nitrogen is disposed in a thickness of 1 μm. On the upper cladding layer 24, a contact layer 25 formed of p$^+$-type ZnSe doped with nitrogen is disposed in a thickness of 0.2 μm. An insulation layer 26 is disposed on the contact layer 25, and a p-type electrode 27 is disposed on the contact layer 25 so as to cover the insulation layer 26. An n-type electrode 28 is disposed on a surface of the substrate 21 opposite to the lower cladding layer 22.

In the formation of the MQW active region 23, the composition of the well layer and the barrier layer and the thickness of the barrier layer are controlled so that the emission center level in the well layer formed of $Zn_{0.4}Cd_{0.6}$S in the valence band and the quantum level in the barrier layer will satisfy the resonance conditions. The resultant semiconductor laser 29 has a staggered-type (type II) heterojunction superlattice structure including quantum well layers and barrier layers.

Figure 9:
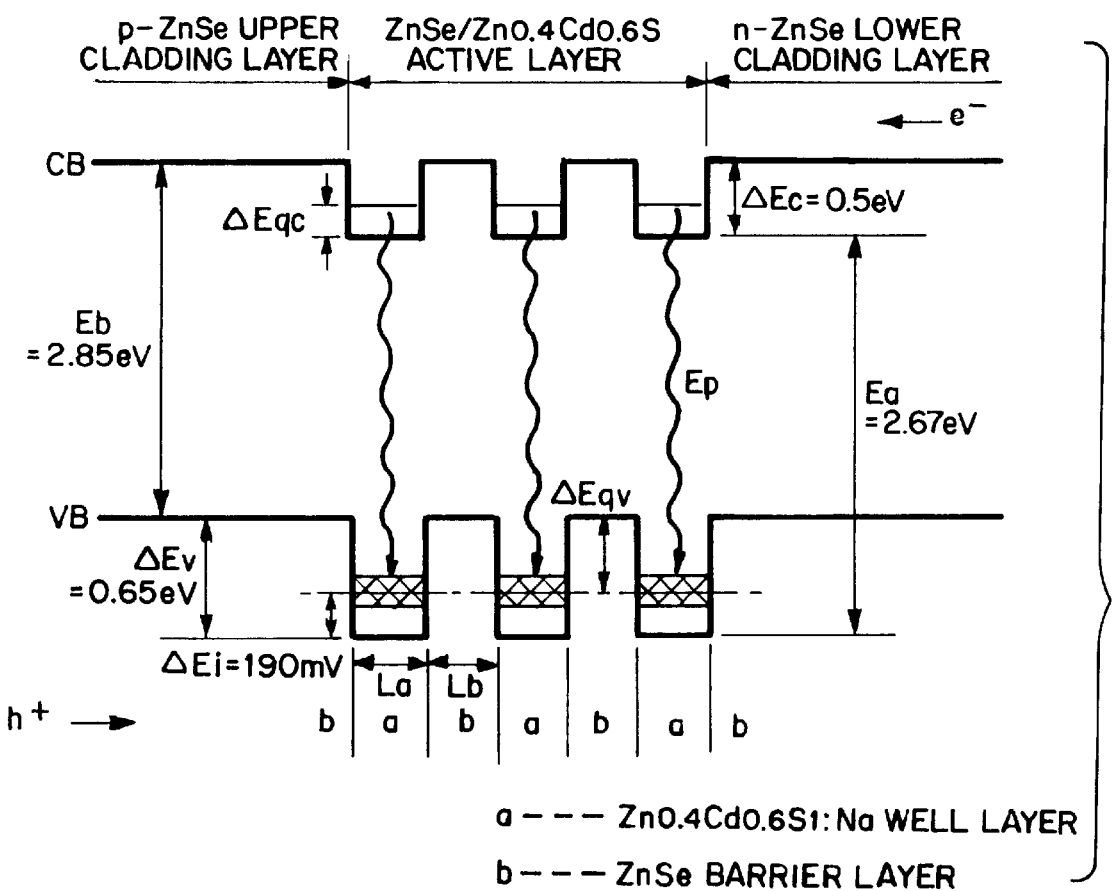
FIG. 9 is a diagram illustrating a band line-up of the semiconductor laser shown in FIG. 8.

FIG. 9 is a diagram illustrating a band line-up of the semiconductor laser 29. ZnSe/$Zn_{1-x}Cd_x$S-type materials are lattice-matched with the GaAs substrate 21 when the alloy composition ratio x=0.6. As is appreciated from FIG. 9, the heterojunction is of the staggered type (type II) as in the first examples By doping sodium (Na) into the $Zn_{0.4}Cd_{0.6}S$, an acceptor level is formed in the valence band to form an emission level. In such a case, $\Delta Ei=190$ meV. Accordingly, by controlling the quantum level $\Delta Eqv$ of the valence band in the barrier layer b so as to be equal to or greater than the emission center level in the well layer a by $k_b T$, the electrons in the quantum level $\Delta Eqv$ can transfer to the emission center level in the well layer a by the resonance tunneling effect. The above-mentioned quantum level $\Delta Eqv$ and the emission center level are equal to each other when $$\Delta Ev = \Delta Eqv + \Delta Ei \qquad (8)$$

The band off-set $\Delta Ev$ in the valence band between the well layer a and the barrier layer b is $\Delta Ev=0.65$ eV Since $\Delta Ei=190$ meV, $\Delta Eqv=0.46$ eV. The thickness Lb which fulfills such conditions is expressed by equation (9)

$$\Delta Lb = \sqrt{\{((h/2\pi)^2 / 2m_h) \times (\pi^2 / \Delta Eqv)\}} \qquad (9)$$

where h is the Planck's constant. By substituting $m_h=0.60$ $m_o$ to equation (9), $\Delta Lb=1.2$ nm is obtained.

The quantum level of the conduction band in the well layer a is approximately expressed by equation (10).

$$\Delta Eqc = ((h/2\pi)^2 / 2m_c) \times (\pi/La)^2 \qquad (10)$$

When La=5 nm and $m_c=0.287$ $m_c$, $\Delta Eqc=52$ meV. The emission energy Ep in this case is expressed by equation (11).

$$Ep = \Delta Eqc + Ea - \Delta Ei \qquad (11)$$

Since the band gap energy of the well layer a is Ea=2.67 eV, the emission energy is Ep=2.52 eV.

With reference to FIG. 8, the semiconductor laser 29 is fabricated in the following manner. On the substrate 21 formed of GaAs, which is lattice-matched with ZnSe/$Zn_{0.4}Cd_{0.6}S$-type materials, the layers 22 through 25 are formed by epitaxial growth. In detail, on the n-type GaAs substrate 21, the lower cladding layer 22 formed of n-type ZnSe doped with chlorine is epitaxially grown to a thickness of 1.5 $\mu$m. The MQW active region 23 including the barrier layers formed of non-doped ZnSe and the well layers formed of $Zn_{0.4}Cd_{0.6}S$:Na in the above-described structure is epitaxially grown to a thickness of 61.2 nm on the lower cladding layer 22. On the MQW active region 23, the upper cladding layer 24 formed of p-type ZnSe doped with nitrogen is epitaxially grown to a thickness of 1 $\mu$m. On the upper cladding layer 24, the contact layer 25 formed of $p^+$-type ZnSe doped with nitrogen is epitaxially grown to a thickness of 0.2 $\mu$m.

The lower cladding layer 22, as well as the upper cladding layer 24, is formed of ZnSe in order to interpose the MQW active region 23 between two ZnSe layers having a low refractive index to confine the light, thus to oscillate light in the semiconductor laser 29. In the valence band, the barrier layer b formed of ZnSe has a lower barrier than the well layer a formed of $Zn_{0.4}Cd_{0.6}S$ with respect to the holes. However, the diffusion wavelength of the holes is shorter than that of the electrons. Accordingly, the carriers can be sufficiently confined in the MOW active region 23 to obtain the resonance tunneling effect with respect to the holes.

After the epitaxial growth of the layers 22 through 25, the insulation layer 26 is formed of polyimide or $SiO_2$ to a thickness of 0.1 $\mu$m on the contact layer 25. Then, a stripe having a width of approximately 2 $\mu$m is formed in the insulation layer 26 as a waveguide for laser oscillation. Then, the electrodes 27 and 28 are formed on the contact layer 25 and the substrata 21, respectively.

The semiconductor laser 29 having the above-described structure emits light having a wavelength of 490 nm. The threshold current is 300 mA, and the threshold current density is 3 $kA/cm^3$.

The heterojunction of ZnSe/$Zn_{0.4}Cd_{0.6}S$-type materials is advantageous to realize high quality crystal growth since such materials are lattice-matched with the GaAs substrate, but such materials cannot realize laser oscillation in the conventional structure due to the type II heterojunction. In the second example, the emission center level in the well layer a and the quantum level in the barrier layer b fulfill the resonance conditions. Due to such fulfillment, the emission efficiency can be increased to a sufficient level to realize continuous laser oscillation at room temperature. Thus, an effective recombination of the carriers occurs.

In the second example, ZnSe/$Zn_{0.4}Cd_{0.6}S$-type materials which are lattice-matched with the GaAs substrate are used. The alloy composition ratio of cadmium (Cd) of the well layer can be changed or ZnSSe can be used for the barrier layer in order to introduce distortion to the well layer or the barrier layer, thereby reducing the threshold current or improving other characteristics. In order to shorten the wavelength of the emitted light, MgZnSe/MgCdS-type materials can be used.

EXAMPLE 3

An LED 39 in a third example according to the present invention will be described with reference to FIGS. 10 and 11.

Figure 10:
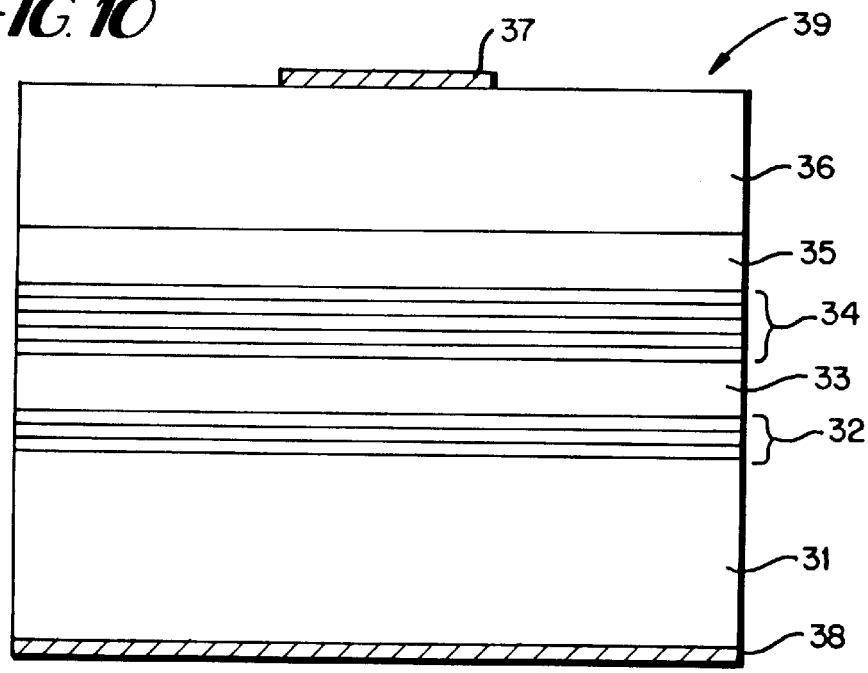
FIG. 10 is a cross sectional view of an LED in a third example according to the present invention.

FIG. 10 is a cross sectional view of the LED 39 in the third example. The LED 39 includes a substrate 31 formed of p-type GaAs which is lattice-matched with ZnSe/$Zn_{0.4}Cd_{0.6}S$-type materials. On the substrate 31, a DBR (Distributed Bragg Reflector) region 32 is formed. On the DBR region 32, a lower (first) cladding layer 33 formed of p-type ZnSe doped with nitrogen is disposed The DBR region 32 includes 20 ZnSe layers doped with nitrogen (each having a thickness of 10 nm) and 20 $Zn_{0.4}Cd_{0.6}S$ layers doped with nitrogen (each having a thickness of 10 nm). The 20 ZnSe layers and the 20 $Zn_{0.4}Cd_{0.6}S$ layers formed of such materials are stacked alternately to form 20 pairs. On the lower cladding layer 33, an MQW active region 34 is disposed. The MQW active region 3A includes 40 well layers formed of non-doped ZnSe:In and 40 barrier layers formed of non-doped $Zn_{0.4}Cd_{0.6}S$. The 40 barrier layers and the 40 well layers formed of such materials are stacked alternately to form 40 pairs.

On the MQW active region 34, an upper (second) cladding layer 35 formed of n-type $Zn_{0.4}Cd_{0.6}S$ doped with chlorine is disposed in a thickness of 1 $\mu$m. On the upper cladding layer 35, a current diffusion layer 36 formed of n-type $Zn_{0.4}Cd_{0.6}S$ doped with chlorine is disposed in a thickness of 7 $\mu$m.

An n-type electrode 37 is disposed on the current diffusion layer 36, and a p-type electrode 38 is disposed on a surface of the p-type GaAs substrate 31 opposite to the DBR region 32.

In the formation of the MQW active region 34, the composition of the well layer and the barrier layer and the thickness of the barrier layer are controlled so that the emission center level of the valence band in the well layer and the quantum level in the barrier layer will satisfy the resonance conditions in order to improve the emission efficiency. The resultant LED 39 has a staggered-type (type II) heterojunction superlattice structure including quantum well layers and barrier layers.

Figure 11:
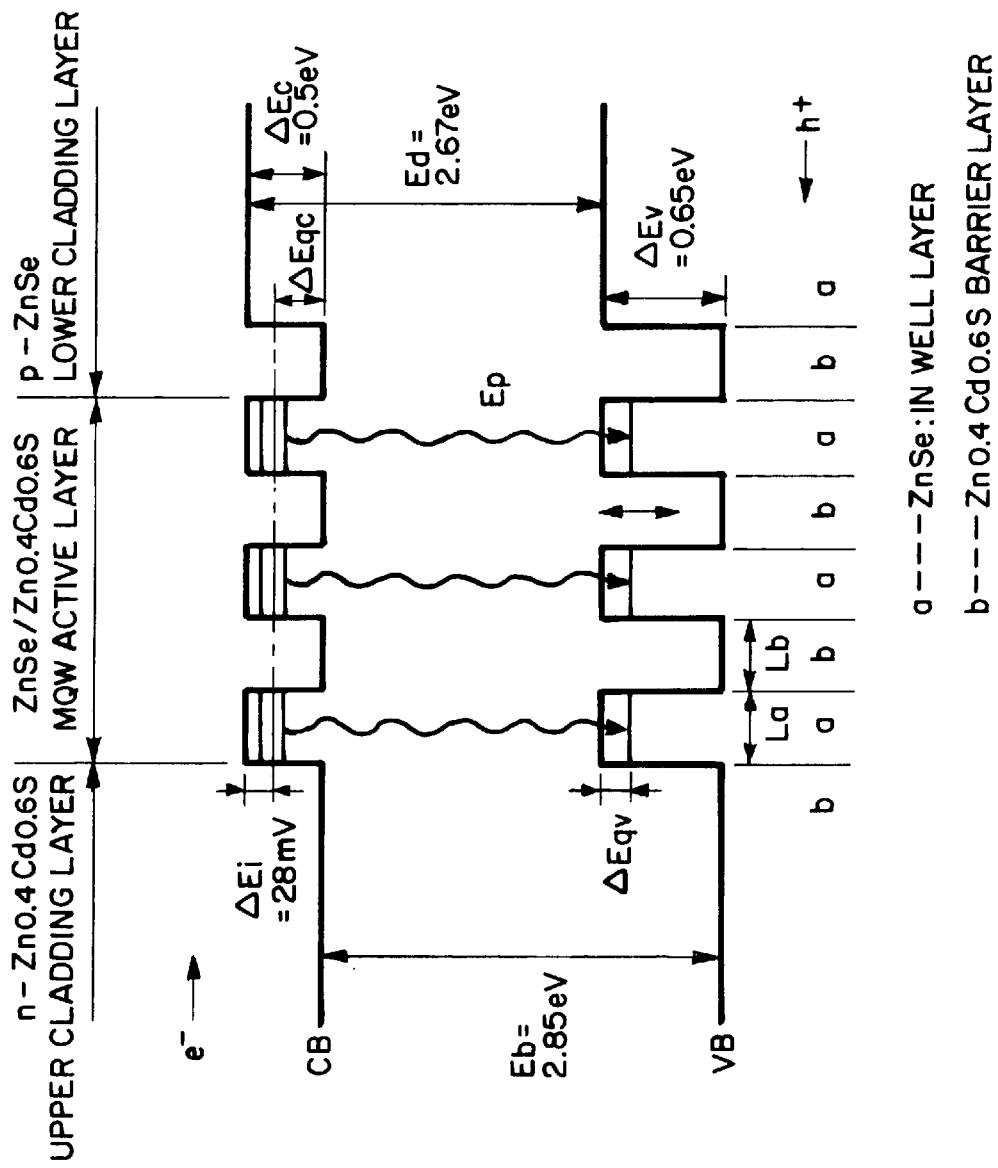
FIG. 11 is a diagram illustrating a band lineup of the LED shown in FIG. 10.
Figure 12:
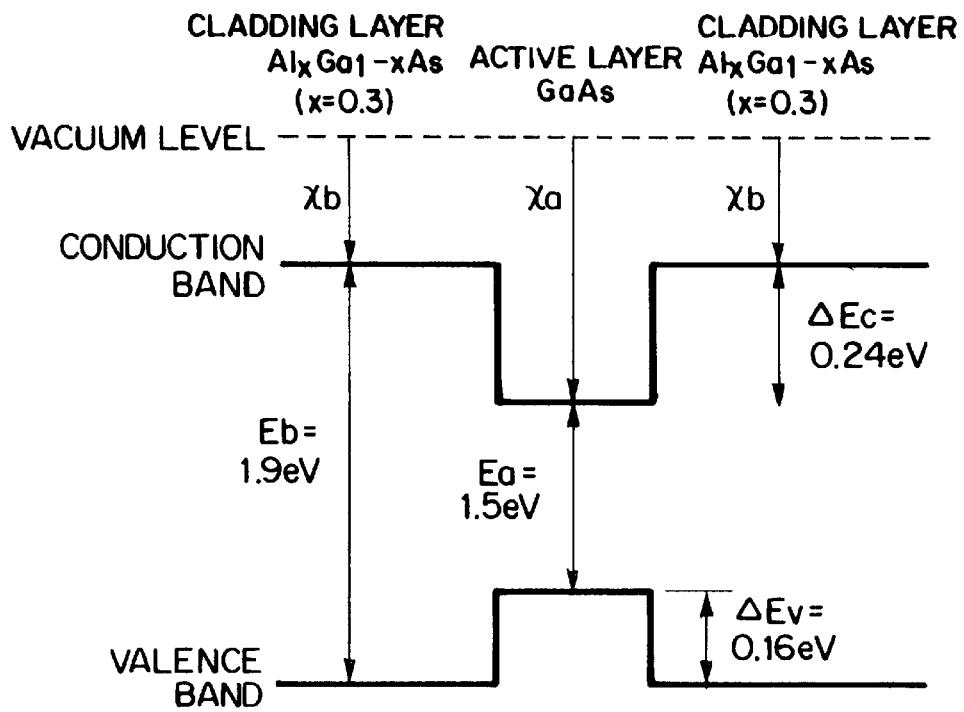
FIG. 12 is a diagram illustrating a band line-up of a conventional LED having a heterojunction.

FIG. 11 is a diagram illustrating a band alignment of the LED 39. Although the MQW active region 34 includes heterojunction of ZnSe/Zn$_{0.4}$Cd$_{0.6}$S-type materials as in the second example, ZnSe is used for the well layer a. Thus, light having a shorter wavelength can be emitted. ZnSe used for the well layer a is doped with Al, gallium (Ga) or indium (In) for forming a donor level to form an emission center level. The localized level of In is ΔEi=28 meV. In this case, the resonance conditions are expressed by equation (2). When ΔEc=0.5 eV, ΔEqc=0.474 eV. The thickness Lb of the barrier layer b is determined by equation (12) where h is the Planck's constant.

$$\Delta Lb = \sqrt{\{((h/2\pi)^2 / 2m_e) \times (\pi^2 / \Delta^2 / \Delta Eqc)\}}. \quad (12)$$

When the effective mass of the electrons in the barrier layer b is $m_e$=0.287 $m_e$, Lb=1.7 nm. The quantum level ΔEqv of the valence band in the well layer a is found in the same manner as in the first example. When the thickness La of the well layer a is 5 nm and the effective mass of the holes in the well layer a is $m_h$=0.60 $m_e$, ΔEqv=25 meV from equation (6). From the above-described values of ΔEi, ΔEgv and Ea, the emission energy Ea=2.595 eV from equation (6).

With reference to FIG. 10, the LED 39 is fabricated in the following manner. On the substrate 31 formed of p-type GaAs, which is lattice-matched with ZnSe/Zn$_{0.4}$Cd$_{0.6}$S-type materials, the DBR region 32 and the lower cladding layer 33 formed of p-type ZnSe doped with nitrogen are epitaxially grown sequentially. Then, the MQW active region 34, the upper cladding layer 35 formed of n-type Zn$_{0.4}$Cd$_{0.6}$S doped with chlorine, and the current diffusion layer 36 formed of n+-type Zn$_{0.4}$Cd$_{0.6}$S doped with chlorine are epitaxially grown sequentially.

Then, the n-type electrode 37 and the p-type electrode 38 are formed on the current diffusion layer 36 and the substrate 31, respectively.

Since it is not necessary to confine light in the MQW active region 34 of the LED 39, the lower cladding layer 33 and the upper cladding layer 35 can be formed of materials other than ZnSe. In this example, the lower cladding layer 33 is formed of ZnSe and the upper cladding layer 35 is formed of Zn$_{0.4}$Cd$_{0.6}$S for satisfactorily confining the electrons and holes. In addition, the current diffusion layer 36 of an n-type II–VI-group semiconductor is provided on the upper cladding layer 35 because, in the case of an LED, the emission efficiency is improved by increasing the extension of the current on a surface from which light is emitted. Also, a semiconductor layer having a low resistance can easily be obtained by employing an n-type II–VI-group semiconductor material.

The resultant LED 39 emits light having a wavelength of 480 nm and a luminance of 1 cd when employed in a standard product.

A device including a heterojunction of ZnSe:In/Zn$_{0.4}$Cd$_{0.6}$S-type materials cannot generate high luminance light in the conventional structure due to the type II heterojunction. In the third example, the localized level in the well layer a and the quantum level in the barrier layer b fulfill the resonance conditions. Due to such fulfillment, high luminance light can be generated.

In the third example, ZnSe/Zn$_{0.4}$Cd$_{0.6}$S-type materials which are lattice-matched with the GaAs substrate 31 are used. Instead, the layers can be epitaxially grown on a substrate formed of GaP or ZnS, in which case, a graded ZnS$_x$Se$_{1-z}$ layer can be used instead of the DBR region 32 in order to further improve the luminance.

As is appreciated from the above description, the present invention is applicable both to a vertical-cavity surface emitting device and an edge-emitting device.

As has been described so far, due to a superlattice structure including a quantum well layer having a localized level such as an isoelectronic level or an emission center level and a barrier layer having a quantum level which fulfills the resonance conditions together with the localized level, the efficiency of recombination of carriers is increased to improve the emission efficiency and other characteristics even in a device having a heterojunction, in which confinement of carriers is conventionally difficult.

In a superlattice structure including a well layer which obtains a localized level such as an emission center by selective doping, the composition of the quantum well layer and the barrier layer and the thickness of the barrier layer are selected so that the quantum level in the barrier layer and the localized level such as the isoelectronic level or the emission center level in the well layer will fulfill the resonance conditions. By such selection, the carriers confined in the barrier layer can transfer to the localized level such as the isoelectronic level or the emission center level in the well layer. As a result, an effective recombination of carriers can occur to improve the emission efficiency even in a device having a staggered-type (type II) heterojunction, in which confinement of carriers is conventionally difficult. By the resonance tunneling effect for transferring the carriers to the localized level, the isoelectronic level or the emission center level in the well layer, a wider selection of materials for a heterojunction is available, and thus the characteristics of a semiconductor device having a heterojunction can be improved.

In the case where a light emitting layer having a staggered-type (type II) heterojunction superlattice structure is interposed between two cladding layers, the electrons and the holes can be confined at a high efficiency.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light emitting device, comprising:
   a superlattice structure including a quantum well layer and a barrier layer to form a staggered-type band line-up,
   wherein the quantum well layer contains an impurity for supplying an emission center level which is added thereto, and
   wherein the barrier layer is sufficiently thin to allow carriers in the quantum level in the barrier layer to transfer to the emission center level in the quantum well layer by a resonance tunneling effect.

2. A semiconductor light emitting device having an emission center and comprising:
   a superlattice structure active region including a quantum well layer formed of Zn$_{1-x}$Cd$_x$S where an alloy composition ratio x is 0 to 1 and a barrier layer formed of ZnSe, the quantum well layer and the barrier layer being stacked alternately,
   wherein the barrier layer is sufficiently thin to allow holes in a quantum level of a valence band in the barrier layer to transfer to an emission center level provided by the emission center in a forbidden band of the quantum well layer.

3. A semiconductor light emitting device according to claim 2, wherein the alloy composition ratio x is selected so that the energy difference in the valence band between in the quantum well layer and in the barrier layer is no greater than a sum of the difference between the emission center level in the quantum well layer and an energy level of the valence band, and the quantum level in the barrier layer.

4. A semiconductor light emitting device according to claim 2, further comprising:

a substrate of a first conductivity type;

a first cladding layer of the first conductivity type; and a second cladding layer of a second conductivity type, wherein the superlattice structure is interposed between the first cladding layer and the second cladding layer.

5. A semiconductor light emitting device according to claim 4, wherein the first cladding layer has an n-type conductivity and has substantially an identical composition with the barrier layer, and the second cladding layer has a p-type conductivity and has substantially an identical composition with the quantum well layer.

6. A semiconductor light emitting device having an emission center and comprising:

a superlattice structure active region including a quantum well layer formed of ZnSe and a barrier layer formed of $Zn_{1-x}Cd_xS$ where an alloy composition ratio x is 0 to 1, the quantum well layer and the barrier layer being stacked alternately, wherein the barrier layer is sufficiently thin to allow holes in a quantum level of the valence band in the barrier layer to inject to an emission center level provided by the emission center in a forbidden band of the quantum layer.

7. A semiconductor light emitting device according to claim 6, wherein the alloy composition ratio x is selected so that the energy difference in the conduction band between in the quantum well layer and in the barrier layer is no greater than a sum of the difference between an isoelectronic level in the quantum well layer and an energy level of the conduction band, and the quantum level in the barrier layer.

8. A semiconductor light emitting device according to claim 6, further comprising:

a substrate of a first conductivity type;

a first cladding layer of the first conductivity type; and a second cladding layer of a second conductivity type, wherein the superlattice structure is interposed between the first cladding layer and the second cladding layer.

9. A semiconductor light emitting device according to claim 8, wherein the first cladding layer has an n-type conductivity and has substantially an identical composition with the barrier layer, and the second cladding layer has a p-type conductivity and has substantially an identical composition with the quantum well layer.

* * * * *